US011150268B2

(12) United States Patent
Ito

(10) Patent No.: US 11,150,268 B2

(45) Date of Patent: Oct. 19, 2021

(54) ELECTRIC CONNECTION DEVICE

(71) Applicant: Kabushiki Kaisha Nihon Micronics, Tokyo (JP)

(72) Inventor: Tatsuya Ito, Oita (JP)

(73) Assignee: Kabushiki Kaisha Nihon Micronics, Musashino (JP)

( * ) Notice: Subject to any disclaimer, the term of this patent is extended or adjusted under 35 U.S.C. 154(b) by 0 days.

(21) Appl. No.: 16/617,722

(22) PCT Filed: May 17, 2018

(86) PCT No.: PCT/JP2018/019034

§ 371 (c)(1), (2) Date: Nov. 27, 2019

(87) PCT Pub. No.: WO2018/221234

PCT Pub. Date: Dec. 6, 2018

(65) Prior Publication Data

US 2020/0182907 A1 Jun. 11, 2020

(30) Foreign Application Priority Data

May 30, 2017 (JP) ............................ JP2017-106198

(51) Int. Cl.

*H01R 12/70* (2011.01)
*G01R 1/073* (2006.01)

(52) U.S. Cl.

CPC ..... *G01R 1/07307* (2013.01); *H01R 12/7047* (2013.01); *H01R 2201/20* (2013.01)

(58) Field of Classification Search

CPC ........................ H01R 12/7047; H01R 2201/20

USPC ............................................................ 439/78

See application file for complete search history.

(56) References Cited

U.S. PATENT DOCUMENTS 5,974,662 A * 11/1999 Eldridge ........... H01L 23/49811 29/842

6,917,102 B2 * 7/2005 Zhou .................. G01R 1/07378 257/690

7,245,137 B2 * 7/2007 Eldridge .............. G01R 1/0483 257/E23.078

8,493,087 B2 * 7/2013 Cho ................... G01R 1/07378 324/756.03

(Continued)

FOREIGN PATENT DOCUMENTS

JP H05211215 A 8/1993

JP 2007178405 A 7/2007

(Continued)

*Primary Examiner* — Alexander Gilman

(74) *Attorney, Agent, or Firm* — Lorenz & Kopf, LLP

(57) ABSTRACT

An electric connection device, includes: a circuit trace-included member (30); a probe (10) including a base that connects to a circuit trace formed in the circuit trace-included member (30) and a tip that comes into contact with an inspection subject (2); a probe head (20) which is provided next to the circuit trace-included member (30) and holds the probe (10); and a fixing component (100) which is located in the probe head (20) with an end protruding from the probe head (20) toward the circuit trace-included member (30), the end being fixed to a fixing surface (301) of the circuit trace-included member (30) that faces the probe head (20) to connect the probe head (20) and the circuit trace-included member (30).

6 Claims, 6 Drawing Sheets

(56) References Cited

U.S. PATENT DOCUMENTS

| | | | | |
|---|---|---|---|---|
| 8,643,394 | B2 * | 2/2014 | Kuo | G01R 31/2889 324/754.18 |
| 8,736,294 | B2 * | 5/2014 | Chang | G01R 1/07378 324/756.03 |
| 10,041,976 | B2 * | 8/2018 | Gardell | G01R 35/005 |
| 10,184,956 | B2 * | 1/2019 | Kung | G01R 1/07378 |
| 2006/0290367 | A1 * | 12/2006 | Hobbs | G01R 31/31905 324/750.22 |
| 2008/0030214 | A1 * | 2/2008 | Nguyen | G01R 1/06744 324/754.03 |
| 2008/0100312 | A1 * | 5/2008 | Breinlinger | G01R 31/2891 324/756.03 |
| 2008/0150558 | A1 * | 6/2008 | Amemiya | G01R 1/07342 324/756.03 |
| 2008/0284458 | A1 * | 11/2008 | Hosaka | G01R 3/00 324/755.06 |
| 2012/0313659 | A1 * | 12/2012 | Hsu | G01R 1/0735 324/755.05 |
| 2014/0210505 | A1 * | 7/2014 | Chen | G01R 1/0735 324/756.03 |

FOREIGN PATENT DOCUMENTS

| | | | |
|---|---|---|---|
| JP | 2008544283 | A | 12/2008 |
| JP | 2010508533 | A | 3/2010 |
| JP | 2011145279 | A | 7/2011 |
| JP | 2014020787 | A | 2/2014 |
| JP | 2016217855 | A | 12/2016 |
| WO | WO 2007023884 | A | 3/2007 |
| WO | WO2017069028 | A1 | 4/2017 |

* cited by examiner (a)

(b)

ELECTRIC CONNECTION DEVICE

TECHNICAL FIELD

The present invention relates to an electric connection device used for measuring electric characteristics of an inspection subject.

BACKGROUND ART

Measuring electric characteristics of an inspection subject, such as an integrated circuit, as a substrate uses an electric connection device provided with probes that are brought into contact with the inspection subject. The electric connection device employs a configuration in which a probe head that holds probes is attached to a printed circuit board provided with circuit traces electrically connected to the probes. One of such electric connection devices includes a space transformer between the probe head and printed circuit board in order to allow spacing between circuit traces provided on the printed circuit board to be set wider than spacing between the probes (see Patent Literature 1, for example).

As a method to minimize deflection of the probe head, a stiffener (a reinforcement material) provided above the probe head is connected to the probe head with columnar fixing components. In this method, when members provided with interconnection patterns (hereinafter, referred to as circuit trace-included members), including the space transformer and printed circuit board, are located above the probe head, through-holes allowing the fixing components to penetrate therethrough are formed in the circuit trace-included members.

CITATION LIST

Patent Literature

PTL 1: Japanese Patent Laid-open Publication No. 2007-178405

SUMMARY OF INVENTION

Technical Problem

Forming through-holes in the circuit trace-included members increases regions where traces cannot be arranged in the circuit trace-included members, and lowered flexibility in the interconnection layout reduces the routing efficiency. It is therefore necessary to increase the area of each circuit trace-included member or employ a multilayer structure. This causes problems, including an increase in manufacturing cost.

In the light of the aforementioned problems, an object of the present invention is to provide an electric connection device in which the probe head is less likely to deflect and the circuit trace-included members are prevented from degreasing in routing efficiency.

Solution to Problem

According to an aspect of the present invention, an electric connection device includes: a circuit trace-included member; a probe including a base that connects to a circuit trace formed on the circuit trace-included member and a tip that comes into contact with an inspection subject; a probe head which is provided next to the circuit trace-included member and holds the probe; and a fixing component which is provided in the probe head with an end protruding from the probe head toward the circuit trace-included member, the end being fixed to a fixing surface of the circuit trace-included member that faces the probe head to connect the probe head and the circuit trace-included member.

Advantageous Effects of Invention

According to the present invention, it is possible to provide an electric connection device in which the probe head is less likely to deflect and the circuit trace-included member is prevented from degreasing in routing efficiency.

BRIEF DESCRIPTION OF DRAWINGS

FIG. 2(*b*) illustrating the fixing component and anchor that are joined.

DESCRIPTION OF EMBODIMENT

Figure 1:
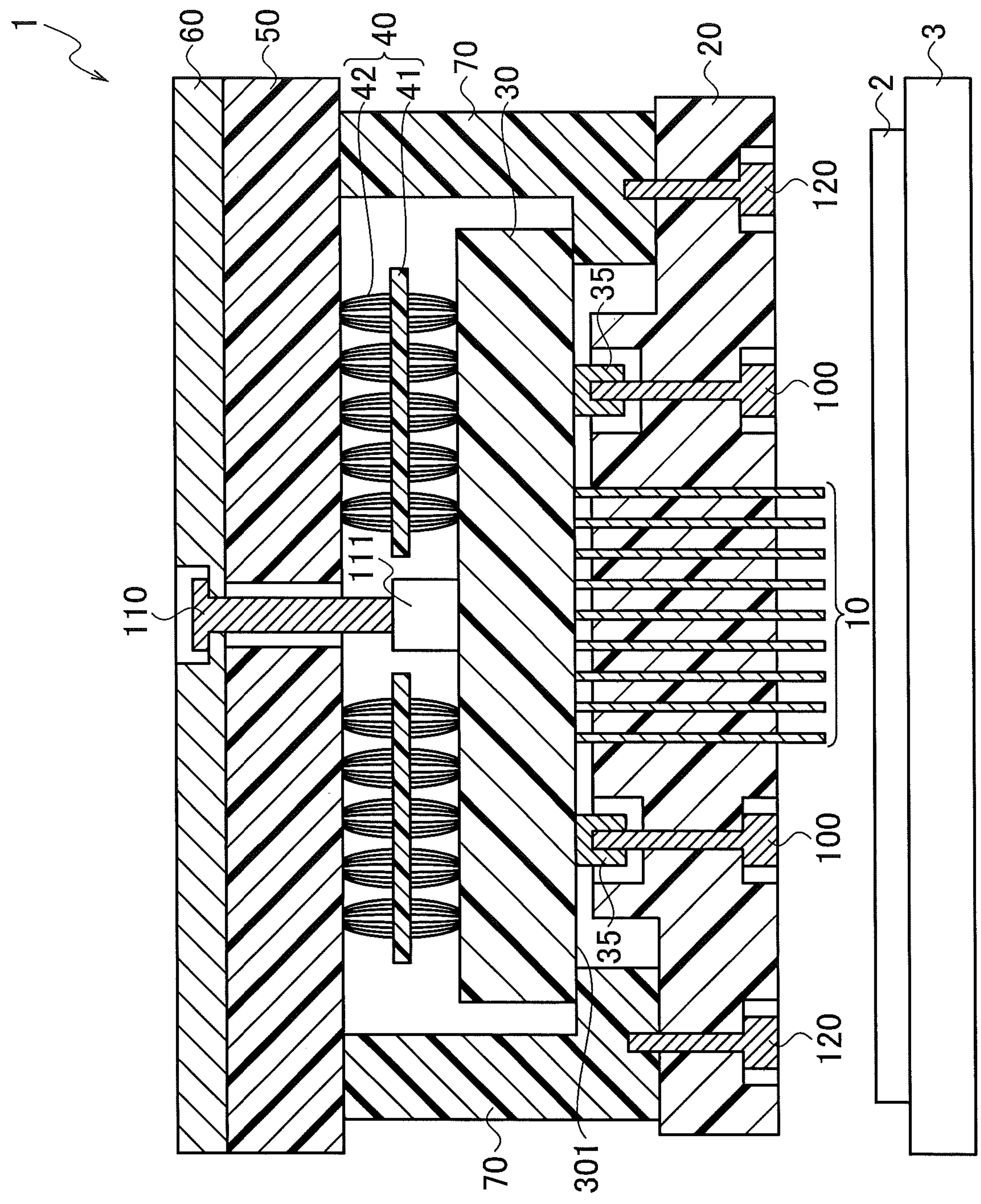
FIG. 1 is a schematic view illustrating the configuration of an electric connection device according to an embodiment of the present invention.

Next, an embodiment of the present invention is described with reference to the drawings. In the following description of the drawings, the same or similar portions are given the same or similar reference numerals. The drawings are schematic, and it should be noted that thickness proportions and the like are different from real ones. It is also obvious that dimensional relationship or proportions of some portions are different from each other between the drawings. The embodiment below illustrates a device and a method to embody the technical idea of the present invention. The embodiment of the present invention does not specify the material, shape, structure, arrangement, and the like of the constituent components to those described below.

An electric connection device 1 according to an embodiment of the present invention illustrated in FIG. 1 is used for measurement of electric characteristics of an inspection subject 2. The electric connection device 1 is a vertically-moving probe card. In the measurement process of the inspection subject 2, tips of probes 10 come into contact with inspection pads (not illustrate) of the inspection subject 2. In FIG. 1, the probes 10 are not in contact with the inspection subject 2. In measurement, a chuck 3 on which the inspection subject 2 is placed, for example, moves upward, and the tips of the probes 10 then come into contact with the inspection subject 2.

The electric connection device 1 includes a circuit trace-included member 30, the probes 10, the probe head 20, and fixing components 100. The probes 10 include bases that are connected to circuit traces (not illustrated) formed in the circuit trace-included member 30. The probe head 20 is provided next to the circuit trace-included member 30 and holds the probes 10. The fixing components 100 are provided in the probe head 20 so that an end of each fixing component 100 protrudes from the probe head 20 toward the circuit trace-included member 30. The end of each fixing component 100 is fixed to a fixing surface 301 of the circuit trace-included member 30, that faces the probe head 20. The fixing components 100 thus connect the probe head 20 and circuit trace-included member 30.

The fixing components 100 are made of SUS or a steel material, for example. The fixing components 100 illustrated in FIG. 1 are pin-shaped. The shaft of each fixing component 100 penetrates the probe head 20 while the head of the fixing component 100 connected to the shaft is in contact with the probe head 20. Specifically, the head of the fixing component 100 is housed in a recess provided in the lower surface of the probe head 20.

As illustrated in FIG. 1, anchors 35, each of which connects to an end of the corresponding fixing component 100, are provided on the fixing surface 301 of the circuit trace-included member 30. The anchors 35 are composed of about 1 to 3 mm thick blocks made of SUS or a steel material, for example. In the upper surface of the probe head 20, a recess is formed corresponding to the region where each anchor 35 is provided. The anchors 35 are provided within the respective recesses formed in the upper surface of the probe head 20. This prevents the probe head 20 and anchors 35 from coming into contact with each other.

Preferably, the fixing components 100 are screwed into the respective anchors 35. For example, the lower surface of each anchor 35 is processed to an internal screw thread, and an end of each fixing component 100 is processed to an external screw thread. The probe head 20 can thereby be connected to the circuit trace-included member 30 with the fixing members 100 while the distance between the probe head 20 and circuit trace-included member 30 is adjusted.

Providing the plural fixing components 100 allows for adjustment of the distance between the probe head 20 and circuit trace-included member 30 in the vicinity of deflected part of the probe head 20. Specifically, the way of tightening each fixing component 100 is adjusted to control the length of the part exposed between the probe head 20 and circuit trace-included member 30 in the fixing component 100. Deflection of the probe head 20 is thereby corrected.

Figure 2:
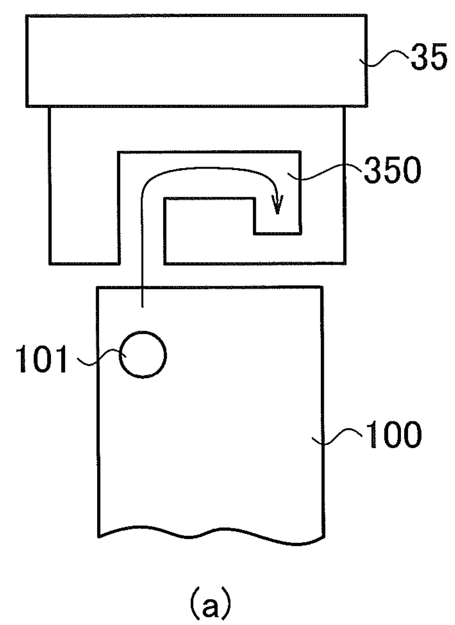
FIGS. 2(*a*) and 2(*b*) are schematic views illustrating a method example for joining a fixing component and an anchor in the electric connection device according to the embodiment of the present invention, FIG. 2(*a*) illustrating the fixing component and anchor that are not joined yet.
Figure 2:
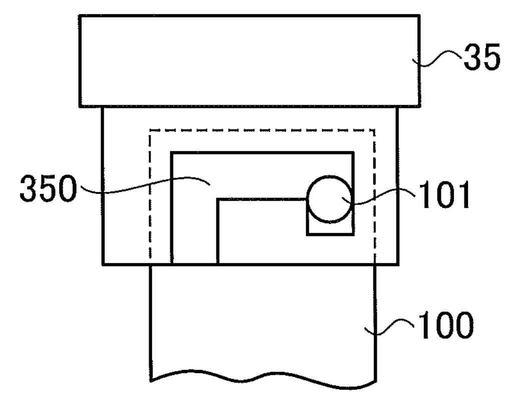

The fixing components 100 and anchors 35 may be joined by a method other than screwing. For example, the fixing components 100 and anchors 35 may be joined by a lock mechanism illustrated in FIGS. 2(*a*) and 2(*b*), for example. As illustrated in FIG. 2(*a*), each anchor 35 is provided with a lock mechanism 350, and each fixing component 100 is provided with a spring pin 101 of a shape corresponding to the shape of the lock mechanism 350, at an end thereof. The fixing component 100 and anchor 350 are joined in the following manner: the end of the fixing component 100 is inserted into the anchor 35, and the fixing component 100 is rotated so that the spring pin 101 is moved as indicated by the arrow in FIG. 2(*a*). The spring pin 101 is thereby fitted to the lock mechanism 350 as illustrated in FIG. 2(*b*). Thereby, the fixed component 100 and the anchors 35 are joined.

In the electric connection device 1 illustrated in FIG. 1, the circuit trace-included member 30 is a space transformer that allows spacing between the circuit traces to be set wider than spacing between the probes 10. The circuit traces which are provided on the fixing surface 301 of the circuit trace-included member 30 and are connected to the bases of the respective probes 10 are connected to the circuit traces provided on the upper surface of the circuit trace-included member 30 that is opposed to the fixing surface 301 through internal interconnections (not illustrated) provided within the circuit trace-included member 30.

Above the circuit trace-included member 30, an interposer 40 and a printed circuit board 50 are stacked. The interposer 40 and printed circuit board 50 are also circuit trace-included members. In the electric connection device 1 illustrated in FIG. 1, thus, the probe head 20, circuit trace-included member 30, interposer 40, and printed circuit board 50 are stacked.

The interposer 40 includes a plate-shaped support section 41 and plural relay members 42, that penetrate the support section 41. The relay members 42 are made of an elastic and conducting material. One end of each relay member 42 exposed in the lower surface of the support section 41 is connected to a circuit trace provided on the upper surface of the circuit trace-included member 30. The other end of the relay member 42 exposed in the upper surface of the support section 41 is connected to a circuit trace provided on the lower surface of the printed circuit substrate 50. The circuit traces of the circuit trace-included member 30 and the circuit traces of the printed circuit substrate 50 are electrically connected through the interposer 40.

Since the relay members 42 are elastic, the relay members 42 elastically deform when the circuit trace-included member 30 or printed circuit board 50 bends. This maintains electric connection between the circuit traces of the circuit trace-included member 30 and the circuit traces of the printed circuit board 50. Providing through-holes in the support section 41 restricts regions where the relay members 42 can be arranged.

The circuit traces formed on the printed circuit board 50 are electrically connected to an inspection apparatus, such as an IC tester (not illustrated). As described above, the probes 10 are electrically connected to the inspection apparatus through the circuit trace-included member 30, interposer 40, and printed circuit board 50. Through the probes 10, the inspection apparatus applies a predetermined voltage or current to the inspection subject 2. Signals outputted from the inspection subject 2 are transmitted to the inspection apparatus through the probes 10 for inspection of characteristics of the inspection subject 2.

On the upper surface of the printed circuit board 50, a stiffener 60 is provided. The stiffener 60 improves the mechanical strength of the electric connection device 1. As illustrated in FIG. 1, the circuit trace-included member 30 is fixed to the stiffener 60 with a support member 110, that penetrates the printed circuit board 50 and interposer 40. To be specific, the tip of the shaft of the pin-shaped support member 110 is fixed to a fixing bracket 111, which is provided on the upper surface of the circuit trace-included member 30. The head of the support member 110 is in contact with the inside of the recess formed in the upper surface of the stiffener 60. The support member 110 is screwed into the fixing bracket 111, for example. By adjusting the tightening strength of the support member 110, deflection of the circuit trace-included member 30 is corrected.

The electric connection device 1 further includes a fixing ring 70, that is provided on the outer edge of the printed circuit board 50. The fixing ring 70 is provided so as to surround the circumferences of the circuit trace-included member 30 and interposer 40. The lower end of the fixing ring 70 includes a section protruding under the circuit trace-included member 30, and the protruding section supports the outer edge of the circuit trace-included member 30 from below. To the protruding section of the fixing ring 70, tips of columnar fixing members 120, that penetrate the outer edge of the probe head 20, are fixed. The circuit trace-included member 30 and probe head 20 are thus supported by the printed circuit board 50 and stiffener 60.

The probe head 20 sometimes deflects due to assembly or processing tolerance in the manufacturing process or deflection of the members. Such deflection of the probe head 20 inhibits stable contact between the bases of the probes 10 and the circuit trace-included member 30, causing contact failures. In order to minimize deflection of the probe head 20, various measures have been considered.

Figure 3:
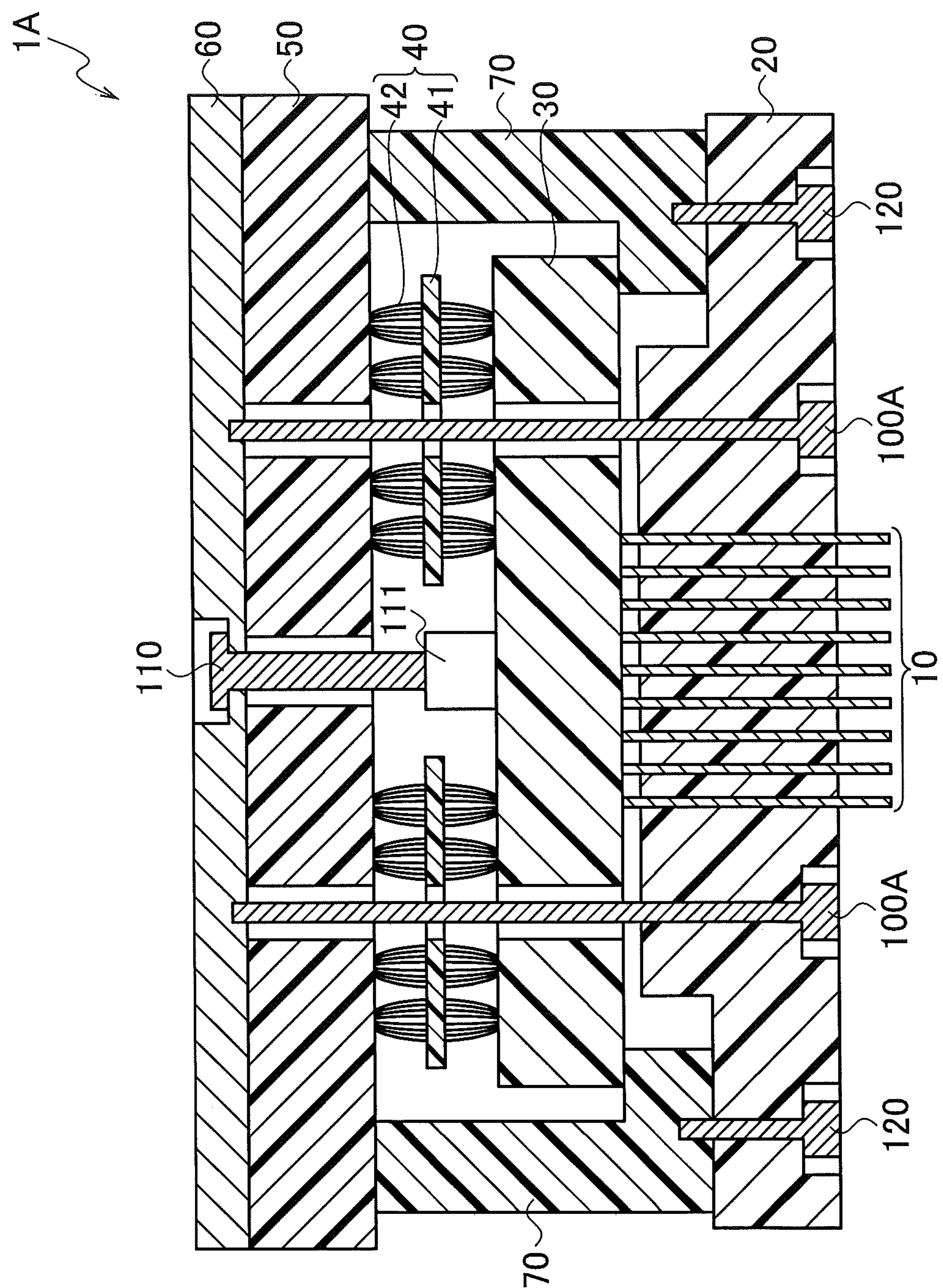
FIG. 3 is a schematic view illustrating the configuration of an electric connection device of Comparative Example.

In an electric connection device 1A of Comparative Example illustrated in FIG. 3, for example, fixing components 100A are inserted from the lower surface of the probe head 20 to the stiffener 60. The fixing components 100A penetrate the circuit trace-included member 30, interposer 40, and printed circuit board 50, in addition to the prober head 20.

Figure 4:
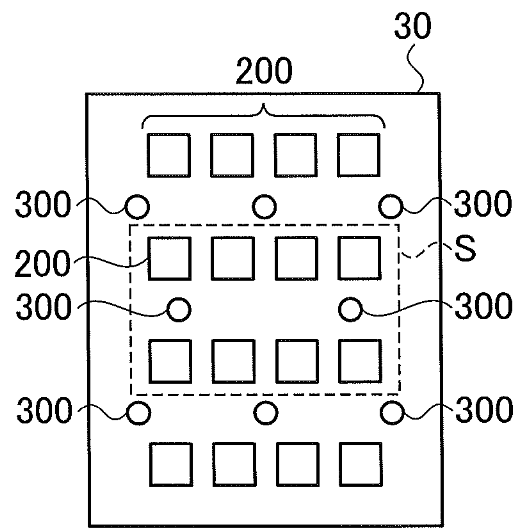
FIG. 4 is a schematic plan view illustrating an arrangement example of through-holes formed in the circuit trace-included member of the electric connection device of Comparative Example.
Figure 5:
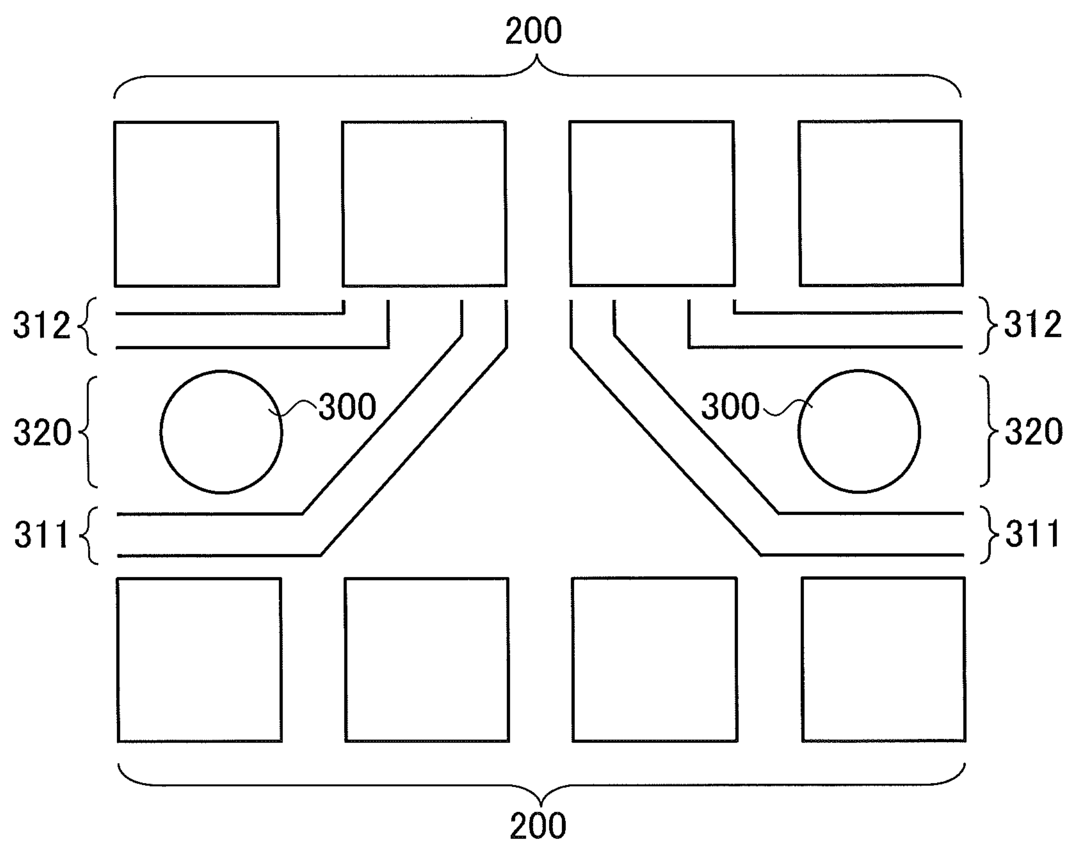
FIG. 5 is a schematic plan view illustrating trace areas of the circuit trace-included member of the electric connection device of Comparative Example.

As illustrated in FIG. 4, the circuit trace-included member 30 includes through-holes 300, that allow the fixing components 100A to penetrate therethrough. Any circuit traces cannot be arranged in and around the through-holes 300. This reduces the routing efficiency in the circuit trace-included member 30. FIG. 5 illustrates an enlarged view of an area S illustrated in FIG. 4.

When the through-holes 300 with a diameter of 3.2 mm in a plan view are formed in the major surface of the circuit trace-included member 30, other than regions where electronic components 200 are formed, for example, circuit traces are forbidden from being arranged in a 1.5 mm region around each through-hole 300. That is, wiring keep-out areas 320 with a diameter of 6.2 mm are set.

When the trace width and pitch are 0.1 mm and 0.1 mm, respectively, a trace region 311 in which six circuit traces can be arranged and a trace region 312 in which five circuit traces can be arranged are set around each through-hole 300. On the other hand, if the through-holes 300 are not formed, 30 circuit traces can be arranged in the trace keep-out region 320 that is produced due to formation of each through-hole 300. Since 11 circuit traces can be arranged in each trace layer, arrangement of the 30 circuit traces that cannot be arranged due to the trace keep-out region 320 requires three more trace layers. Alternatively, it is necessary to increase the size of the circuit trace-included member 30 to increase the area where circuit traces can be arranged. The printed circuit board 50 or the like also needs to employ a multilayer structure or increase in area.

However, the measures including employing a multilayer structure or increasing the area thereof lead to an increase in manufacturing cost of the electric connection device. In addition, an increase in trace resistance and the like due to reduction in routing efficiency could degrade the characteristics of the electric connection device.

Furthermore, forming the through-holes in each circuit trace-included member lengthens the manufacturing process. In addition, in order to control deflection in the structure in which the plural circuit trace-included members are stacked above the probe head 20, each circuit trace-included member requires precision.

Figure 6:
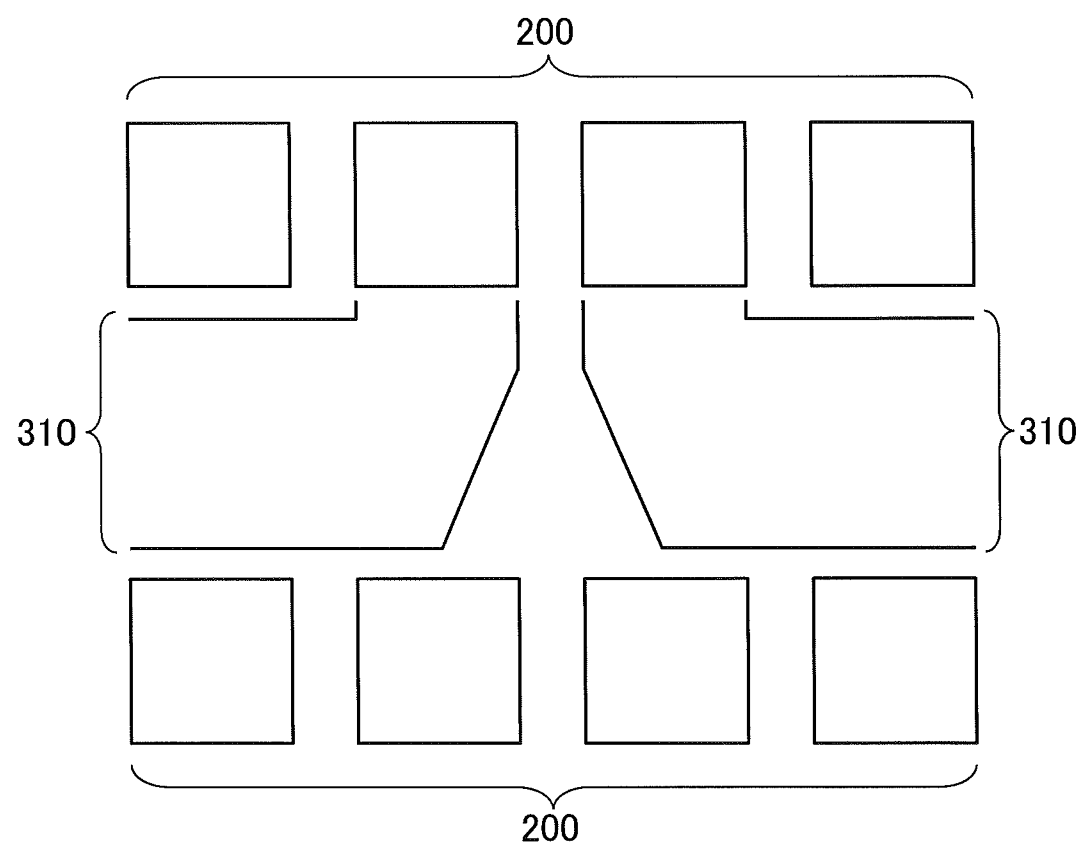
FIG. 6 is a schematic plan view illustrating a circuit trace-included member of the electric connection device according to the embodiment of the present invention.

In the electric connection device 1 illustrated in FIG. 1, no through-hole is formed in the circuit trace-included member 30. It is therefore possible to arrange 41 circuit traces in the wiring region 310 as illustrated in FIG. 6. This prevents the reduction in the routing efficiency without taking any measures, such as employing a multilayer structure or increasing the area. Consequently, the electric connection device 1 does not cause problems, including an increase in manufacturing cost, degradation of characteristics of the electric connection device, and an increase in time required for the manufacturing process that are caused in Comparative Example.

As described above, in the electric connection device 1 according to the embodiment of the present invention, the fixing components 100 that support the probe head 20 so as to prevent the probe head 20 from deflecting are fixed to the fixing surface 301 of the circuit trace-included member 30 that is provided directly above the probe head 20. The fixing components 100 therefore do not penetrate the circuit trace-included members, including the space transformer and printed circuit board. This reduces contact failures due to deflection of the probe head 20 and prevents the reduction in routing efficiency of the circuit trace-included members. According to the electric connection device 1 illustrated in FIG. 1, the circuit traces can be arranged with high density in the space transformer and printed circuit substrate even when the number of probes 10 is increased with an increase in number of pins of the inspection subject 2.

Modification

Figure 7:
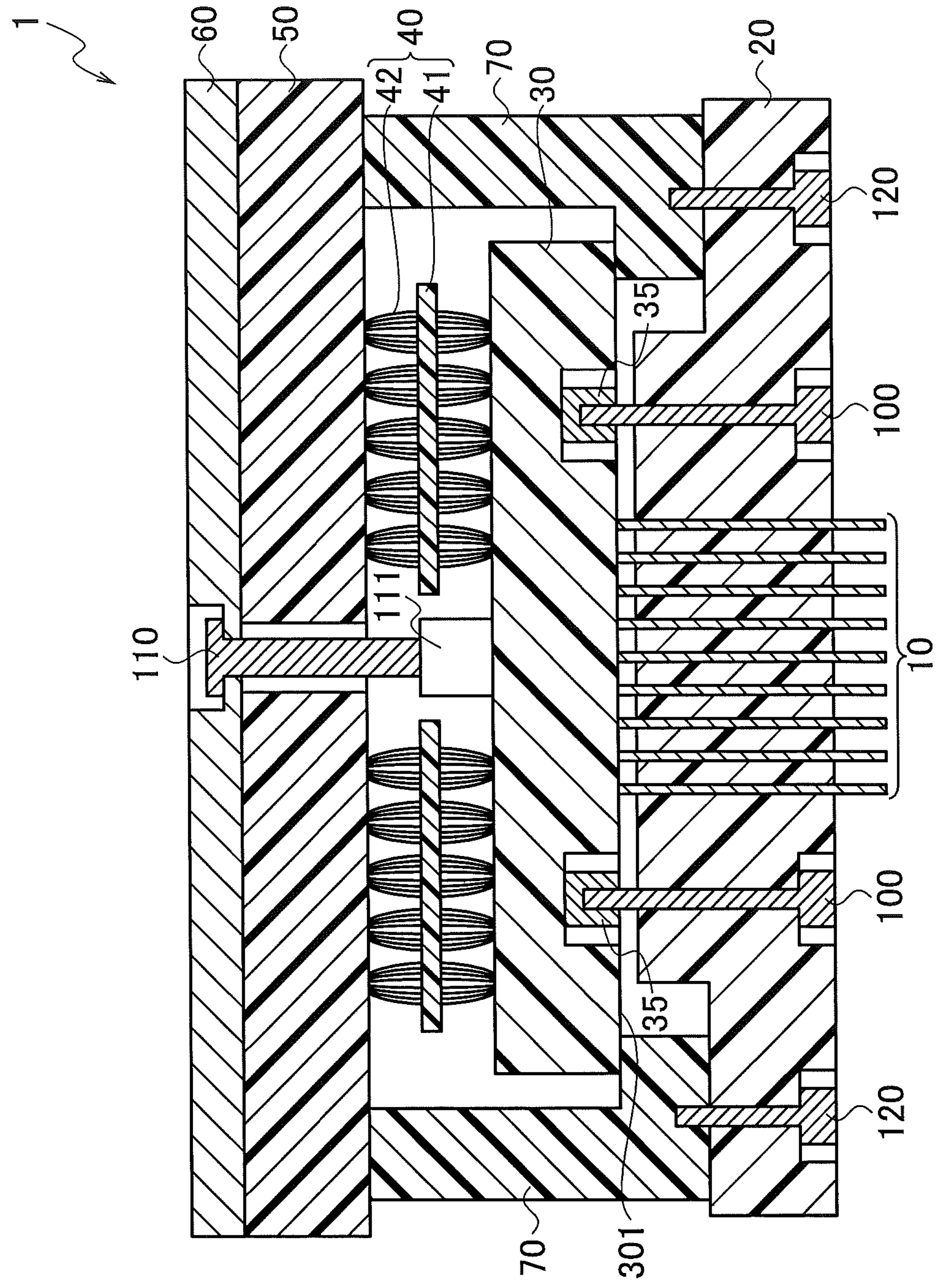
FIG. 7 is a schematic view illustrating the configuration of an electric connection device according to a modification of the embodiment of the present invention.

In an electric connection device 1 of Modification illustrated in FIG. 7, each anchor 35, which is connected to one end of the corresponding fixing component 100, is located within a recess provided in the fixing surface 301 of the circuit trace-included member 30. The other configuration is the same as that of the electric connection device 1 illustrated in FIG. 1.

The probes 10 sometimes need to be shortened for the purpose of measuring high-frequency characteristics of the inspection subject 2 or the like. When the anchors 35 are located on the fixing surface 301 of the circuit trace-included member 30 as illustrated in FIG. 1, the sections of the probes 10 that penetrate the probe head 20 need to be long, corresponding to the thickness of the anchors 35. This inhibits the probes 10 from being shortened.

When the anchors 35 are located on the fixing surface 301 of the circuit trace-included member 30, furthermore, the recesses formed in the regions of the probe head 20 facing the respective anchors 35 need to be a little larger in order to prevent the probe head 20 and anchors 35 from coming into contact. However, the larger the recesses, the lower the mechanical strength of the probe head 20.

According to the electric connection device 1 illustrated in FIG. 7, the anchors 35 are located within the recesses provided in the fixing surface 301 of the circuit trace-included member 30. This allows the probes 10 to be shortened. Furthermore, the recesses to prevent the probes 10 and anchors 35 from coming into contact do not need to be formed in the upper surface of the probe head 20, thus preventing the mechanical strength of the probe head 20 from decreasing.

Forming the recesses in the fixing surface 301 of the circuit trace-included member 30 could reduce the routing efficiency of the circuit trace-included member 30. However, the routing efficiencies of the interposer 40, printed circuit board 50, and the like are not lowered, thus implementing high-density interconnection in these circuit trace-included members.

Other Embodiment

The present invention is explained through the embodiment as described above. However, it should not be understood that the description and drawings constituting a part of the disclosure limits the present invention. This disclosure will reveal various substitutions, examples, and operation techniques for those skilled in the art.

The above description illustrates the case where an end of each fixing component 100 is fixed to the lower surface of the space transformer, for example. The circuit trace-included member 30 to which the fixing components 100 are fixed varies on the configuration of the electric connection device 1. To be specific, when another wiring substrate than the space transformer is located directly above the probe head 20, an end of each fixing component 100 is fixed to the lower surface of the wiring substrate of interest.

In the aforementioned example, the distance between the probe head 20 and circuit trace-included member 30 is adjusted by using the fixing components 100 screwed into the anchors 35. However, the distance between the probe head 20 and circuit trace-included member 30 may be adjusted by another method. For example, the distance between the probe head 20 and circuit trace-included member 30 may be adjusted by replacing the fixing components 100 with the fixing components 100 of different length.

It is certain that the present invention includes various embodiments not described herein and the like.

INDUSTRIAL APPLICABILITY

The electric connection device of the embodiment is applicable to the measurement field of electric characteristics of inspection subjects.

What is claimed is:

1. An electric connection device, comprising:

a circuit trace-included member comprising a fixing surface, an upper surface opposed to the fixing surface, a circuit trace provided on the fixing surface, and a circuit trace provided on the upper surface;

a probe including a base that connects to the circuit trace provided on the fixing surface of the circuit trace-included member and a tip that comes into contact with an inspection subject;

a probe head which is provided next to the circuit trace-included member and holds the probe; and a fixing component which is provided in the probe head with an end protruding from the probe head toward the circuit trace-included member, the end being fixed to the fixing surface of the circuit trace-included member that faces the probe head to connect the probe head to the circuit trace-included member;

wherein the circuit trace, which is provided on the fixing surface of the circuit trace-included member and is connected to the base of the probe, is connected to the circuit trace provided on the upper surface of the circuit trace-included member;

wherein a length of a part exposed between the probe head and the circuit trace-included member in the fixing component is controllable to adjust a distance between the probe head and the circuit trace-included member; and wherein the fixing component penetrates the probe head and is adjustably coupled to the circuit-trace included member.

2. The electric connection device according to claim 1, wherein the fixing component is pin-shaped, and a shaft of the fixing component penetrates the probe head while a head of the fixing component that connects to the shaft is in contact with the probe head.

3. The electric connection device according to claim 1, wherein an anchor that connects to the end is provided on the fixing surface.

4. The electric connection device according to claim 3, wherein the fixing component is screwed into the anchor.

5. The electric connection device according to claim 3, wherein the anchor is provided within a recess provided in the fixing surface of the circuit trace-included member.

6. The electric connection device according to claim 1, wherein the circuit trace-included member is a space transformer to allow spacing between circuit traces to be wider than spacing between probes.

* * * * *